(12) United States Patent
Nielsen et al.

(10) Patent No.: US 7,709,962 B2
(45) Date of Patent: May 4, 2010

(54) LAYOUT STRUCTURE HAVING A FILL ELEMENT ARRANGED AT AN ANGLE TO A CONDUCTING LINE

(75) Inventors: Alexander Nielsen, Ingolstadt (DE); Bernhard Dobler, Erding (DE); Georg Georgakos, Erding (DE)

(73) Assignee: Infineon Technologies AG, Munich (DE)

( * ) Notice: Subject to any disclaimer, the term of this patent is extended or adjusted under 35 U.S.C. 154(b) by 461 days.

(21) Appl. No.: 11/553,788

(22) Filed: Oct. 27, 2006

(65) Prior Publication Data

US 2008/0099790 A1 May 1, 2008

(51) Int. Cl.
*H01L 29/40* (2006.01)
(52) U.S. Cl. .................. 257/773; 257/211; 257/756; 257/758; 257/E21.179
(58) Field of Classification Search .............. 257/206, 257/211, E27.013, 208, 503, 528, E27.009, 257/758, E23.179, 773
See application file for complete search history.

(56) References Cited

U.S. PATENT DOCUMENTS

| | | | |
|---|---|---|---|
| 4,916,514 A | 4/1990 | Nowak | |
| 6,608,335 B2 | 8/2003 | Dixit et al. | |
| 6,770,554 B1 | 8/2004 | Welstand | |
| 2005/0023568 A1 | 2/2005 | Nishimura | |
| 2005/0098895 A1* | 5/2005 | Hung | 257/758 |
| 2008/0164496 A1* | 7/2008 | Kawakami | 257/211 |
| 2008/0211112 A1* | 9/2008 | Wyland | 257/781 |

FOREIGN PATENT DOCUMENTS

| | | |
|---|---|---|
| CN | 1581478 | 2/2005 |
| JP | 2003-017613 | 1/2003 |
| WO | WO2006095655 | * 9/2006 |

OTHER PUBLICATIONS

Brian E. Stine et al., "The Physical and Electrical Effects of Metal-Fill Patterning Practices for Oxide Chemical-Mechanical Polishing Processes", IEEE Transactions on Electron Devices, vol. 45, No. 3, Mar. 1998, pp. 665-679.

* cited by examiner

*Primary Examiner*—Marcos D. Pizarro
*Assistant Examiner*—Eva Y. Montalvo
(74) *Attorney, Agent, or Firm*—Patterson & Sheridan, L.L.P.

(57) ABSTRACT

A layout structure is provided with a conducting line extending in a conducting line direction, the conducting line being arranged within a substrate area, a fill element being arranged within the substrate area at a predetermined distance from the conducting line, the fill element having a fill element axis extending perpendicularly to a side of the fill element in a fill element direction, an angle between the conducting line direction and the fill element direction being greater than 0° and smaller than 90°.

13 Claims, 11 Drawing Sheets

Non-orthogonal fill shapes in direction of current flow

| Density in % | 30% | 35% | 40% | 45% | 50% | 55% | 60% | 65% | 70% |
|---|---|---|---|---|---|---|---|---|---|
| Conventional fill | 5139 | 1098 | 927 | 562 | 856 | 40 | 0 | 0 | 0 |
| 45 degree fill | 4363 | 862 | 716 | 1300 | 1091 | 54 | 0 | 0 | 0 |

LAYOUT STRUCTURE HAVING A FILL ELEMENT ARRANGED AT AN ANGLE TO A CONDUCTING LINE

BACKGROUND OF THE INVENTION

1. Field of the Invention

The present invention is directed to a layout structure with a fill element arranged within a substrate area.

2. Description of the Related Art

In order to provide for a uniform metal density distribution across a chip or locally within a chip or substrate area, a fill pattern comprising fill elements influencing the coupling characteristic and further supporting the silicon processing with an impact on the yield and performance may be generated.

Usually, fill elements are formed by conducting elements arranged e.g. in a vicinity of conducting lines. Unfortunately, a conductive fill pattern increases an interconnect (coupling) capacity which leads to an increased cross and noise coupling and therefore reduces the circuit performance and makes a timing sign-off difficult.

In order to achieve a uniform density, smaller fill shapes filling smaller empty areas or a reduced distance of the fill pattern with respect to the layout structure may be used. Unfortunately, the coupling capacity would increase even more in that case. Thus, although a higher density is achievable due to smaller fill shapes, the introduced parasitic capacity may have an impact on a signal's integrity.

SUMMARY OF THE INVENTION

An embodiment of the present invention provides a layout structure (e.g. a coupling structure) with a conducting line (e.g. a metal line) extending in a conducting line direction, the conducting line being arranged within a substrate area, a fill element being arranged within the substrate area at a predetermined distance from the conducting line, the fill element having a fill element axis extending perpendicularly to a side (e.g. to a straight line formed by the side) of the fill element in a fill element direction, an angle between the conducting line direction and the fill element direction being greater than 0° and smaller than 90°. Therefore, the coupling capacity between the fill elements and the conducting line is reduced.

The fill element may be floating, connected to ground or a voltage source, e.g. Vdd. Furthermore, the layout structures may be e.g. chip or board layout structures.

According to an embodiment, the angle is in the range between 40° and 50°. For example, the angle equals to 45° in one embodiment.

According to an embodiment, the layout structure further comprises a further conducting line arranged within the substrate area and extending in a further conducting line direction, an angle between the fill element direction and the further conducting line direction being greater than 0° and smaller than 90°.

According to an embodiment, the layout structure further comprises a plurality of fill elements being arranged within the substrate area to form a fill pattern, each fill element having a fill element axis extending perpendicularly to a side of the fill element in a fill element direction, an angle between the conducting line direction and each of the plurality of fill element directions being greater than 0° and smaller than 90°.

According to an embodiment, the fill element has a polygonal shape, and in a particular embodiment has a substantially rectangular shape.

A further embodiment of the invention provides a layout structure with a plurality of fill elements being arranged within a substrate area to form an elongated fill element structure extending in a fill structure direction, each fill element having a fill element axis extending perpendicularly to a side of the fill element in a fill element direction, an angle between the fill structure direction and a fill element direction being greater than 0° and smaller than 90°.

According to an embodiment, the layout structure further comprises a conducting line extending in a conducting line direction, the conducting line being arranged within the substrate area, the elongated fill element structure being arranged within the substrate area at a predetermined distance range from the conducting line, an angle between the conducting line direction and each fill element direction being greater than 0° and smaller than 90°.

According to an embodiment, the layout structure further comprises a further conducting line arranged within the substrate area and extending in a further conducting line direction, an angle between each fill element direction and the further conducting line direction being greater than 0° and smaller than 90°.

According to an embodiment, the layout structure further comprises a further conducting line arranged within the substrate area, the elongated fill element structure being arranged between the conducting line and the further conducting line.

A further embodiment of the invention provides a layout structure comprising a conducting line extending in a conducting line direction, the conducting line being arranged within a substrate area, the conducting line comprising a plurality of holes, each hole having a hole axis extending perpendicularly to a side of the hole in a hole direction, an angle between the conducting line direction and the hole direction being greater than 0° and smaller than 90°.

A hole or hole structures in a conducting line (e.g. metal line) may improve the manufacturing process with respect to e.g. wide metal lines, since the holes in the metal line provide for a uniform "metal" density. The more uniform the density is the better is the result of a smoothing process based on e.g. CMP (Chemical Mechanical Polishing). Although the holes may be placed orthogonally with respect to a current flow, it is advantageous to rotate the holes within the line by e.g. 45° which improves a functionality of the line without adversely affecting the manufacturing process. The advantages with respect to an electrical functionality result from the fact that the profile of the line is not significantly reduced so that higher current amplitudes are possible and that at the same current force a higher reliability may be obtained, respectively.

A further embodiment of the invention provides a device for coupling comprising a means for conducting extending in a conducting direction, the means for conducting being arranged within a substrate area and a means for filling being arranged within the substrate area at a predetermined distance from the means for conducting, the means for filling having a fill axis extending perpendicularly to a side of the means for filling in a fill axis direction, an angle between the conducting direction and the fill direction being greater than 0° and smaller than 90°.

According to an embodiment, the angle is in the range between 40° and 50°.

According to an embodiment, the device for coupling comprises a plurality of means for filling being arranged within the substrate area to form a fill pattern, a means for filling having a fill axis extending perpendicularly to a side of the means for filling in a fill axis direction, an angle between the conducting direction and each fill axis direction being greater than 0° and smaller than 90°.

According to an embodiment, the device for coupling comprises a plurality of means for filling being arranged within a substrate area to form an elongated fill structure extending in a fill structure direction, each means for filling having a fill axis extending perpendicularly to a side of the means for filling in a fill axis direction, an angle between the fill structure direction and each fill axis direction being greater than 0° and smaller than 90°.

According to an embodiment, the device for coupling comprises means for conducting extending in a conducting direction, the means for conducting being arranged within the substrate area, the elongated fill structure being arranged within the substrate area at a predetermined distance range from the means for conducting, an angle between the conducting direction and each fill axis direction being greater than 0° and smaller than 90°.

A further embodiment of the invention provides a method for manufacturing a layout structure. The method comprises forming a conducting line within a substrate area, the conducting line extending in a conducting line direction and forming a fill element within the substrate area at a predetermined distance from the conducting line, the fill element having a fill element axis extending perpendicularly to a side of the fill element in a fill element direction, an angle between the conducting line direction and the fill element direction being greater than 0° and smaller than 90°.

According to an embodiment, the angle is in the range between 40° and 50°.

According to an embodiment, the method for manufacturing further comprises forming a further conducting line within the substrate area, the further conducting line extending in a further conducting line direction, an angle between the fill element direction and the further conducting line direction being greater than 0° and smaller than 90°.

According to an embodiment, the method for manufacturing further comprises forming a fill pattern comprising a plurality of fill elements within the substrate area, a fill element having a fill element axis extending perpendicularly to a side of the fill element in a fill element direction, an angle between the conducting line direction and each fill element of the plurality of fill element directions being greater than 0° and smaller than 90°.

A further embodiment of the invention provides a method for manufacturing a layout structure. The method comprises forming an elongated fill element structure comprising a plurality of fill elements within a substrate area, the elongated fill element structure extending in a fill structure direction, each fill element having a fill element axis extending perpendicularly to a side of the fill element in a fill element direction, an angle between the fill structure direction and each fill element direction being greater than 0° and smaller than 90°.

According to an embodiment, the method for manufacturing comprises forming a conducting line within the substrate area, the conducting line extending in a conducting line direction, forming the elongated fill element structure within the substrate area at a predetermined distance range from the conducting line, an angle between the conducting line direction and each fill element direction being greater than 0° and smaller than 90°.

According to an embodiment, the method for manufacturing comprises forming a further conducting line within the substrate area, the further conducting line extending in a further conducting line direction, an angle between each fill element direction and the further conducting line direction being greater than 0° and smaller than 90°.

According to an embodiment, the method for manufacturing comprises forming a further conducting line within the substrate area and arranging the elongated fill element structure between the conducting line and the further conducting line.

A further embodiment of the invention provides a method for manufacturing a device for coupling. The method comprises forming means for conducting within a substrate area, the means for conducting extending in a conducting direction and forming means for filling within the substrate area at a predetermined distance from the means for conducting, the means for filling having a fill axis extending perpendicularly to a side of the means for filling in a fill axis direction, an angle between the conducting direction and the fill axis direction being greater than 0° and smaller than 90°.

A further embodiment of the invention provides a method for manufacturing a device for coupling. The method comprises forming a means for conducting extending in a conducting direction, the means for conducting being arranged within a substrate area and forming means for filling within the substrate area at a predetermined distance from the means for conducting, the means for filling having a fill axis extending perpendicularly to a side of the means for filling in a fill axis direction, an angle between the conducting direction and the fill axis direction being greater than 0° and smaller than 90°.

The fill pattern can be placed closer to e.g. an active shape so that an improved density distribution and/or a reduced coupling capacity can be achieved. Therefore, by way of example, the interconnect capacity is negligible for 99% of nets and does not need to be considered during the implementation process.

BRIEF DESCRIPTION OF THE DRAWINGS

Before the invention is described in detail, it is to be understood that this invention is not limited to the particular component parts of the devices described or steps of the methods described as such devices and methods may vary. It is also to be understood that the terminology used herein is for purposes of describing particular embodiments only, and is not intended to be limiting. It must be noted that, as used in the specification and the appended claims, the singular forms "a," "an" and "the" include singular and/or plural referents unless the context clearly dictates otherwise.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

Further embodiments of the invention will be described in the following with respect to the accompanying figures, in which.

DETAILED DESCRIPTION OF THE PREFERRED EMBODIMENT

Figure 1:
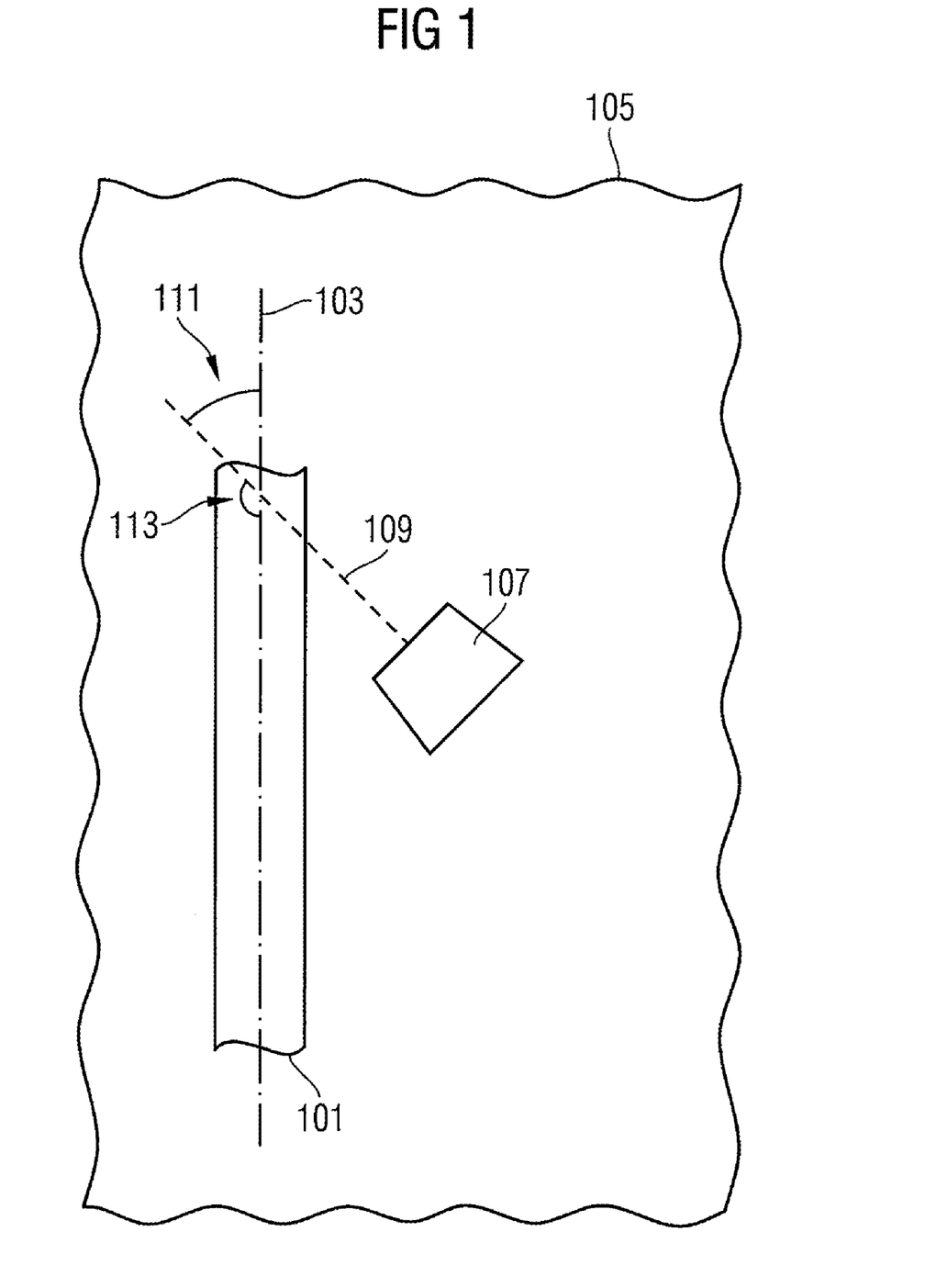
FIG. 1 shows a layout structure.

FIG. 1 shows a layout structure comprising a conducting line 101 extending in a conducting line direction 103. The conducting line 101 is arranged within a substrate area 105. The substrate area 105 may be arranged on a surface of or within the substrate, e.g. a silicon-based substrate. The layout structure further comprises a fill element 107 having a fill element axis 109 extending perpendicularly to a side of the fill element. In other words, the fill element axis 109 coincides with a fill element direction, wherein an angle 111 between the conducting line direction 103 and the fill element direction 109 is acute, i.e. greater than 0° and smaller than 90°. Correspondingly, a further angle 113 is greater than 90°. The fill element 107 has a substantially polygonal shape and, in a particular embodiment, is a parallelogram. For example, the fill element may have a substantially rectangular shape and is rotated relative to the conducting line by the angle 111. In the case of a rectangle having one dimension greater than another dimension, the fill element axis 109 is the major axis of the fill element 107.

Figure 2:
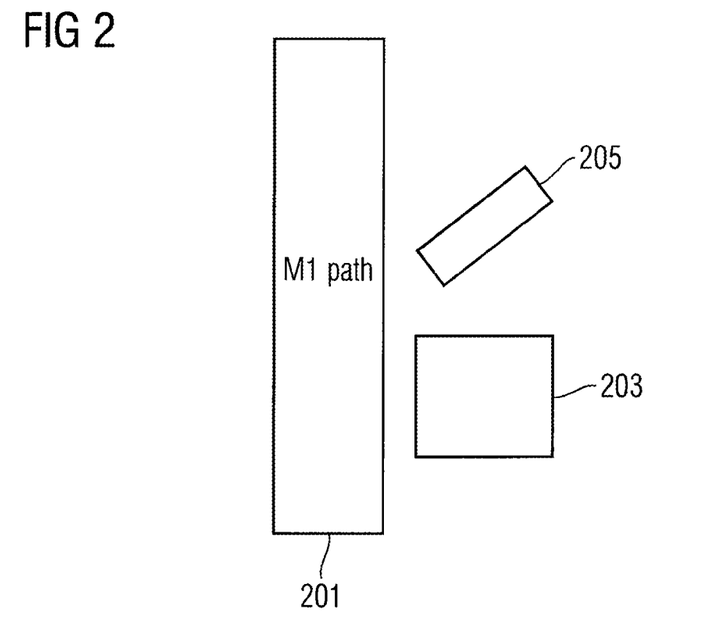
FIG. 2 shows a layout structure.

FIG. 2 shows a layout structure comprising a conducting line 201 (M1 path), an orthogonal fill element 203 (having sides substantially orthogonal to the direction of the conducting line 201 and sides that substantially parallel to the direction of the conducting line 201) and a fill element 205 rotated with respect to the conducting line 201 by 45°. Thus, the rotated fill element 205 forming a fill shape with 45° orientation can be placed closer to an active shape like e.g. the conducting line 201 without contributing to an increase of the coupling capacity than the orthogonal fill shape 203.

Figure 3:
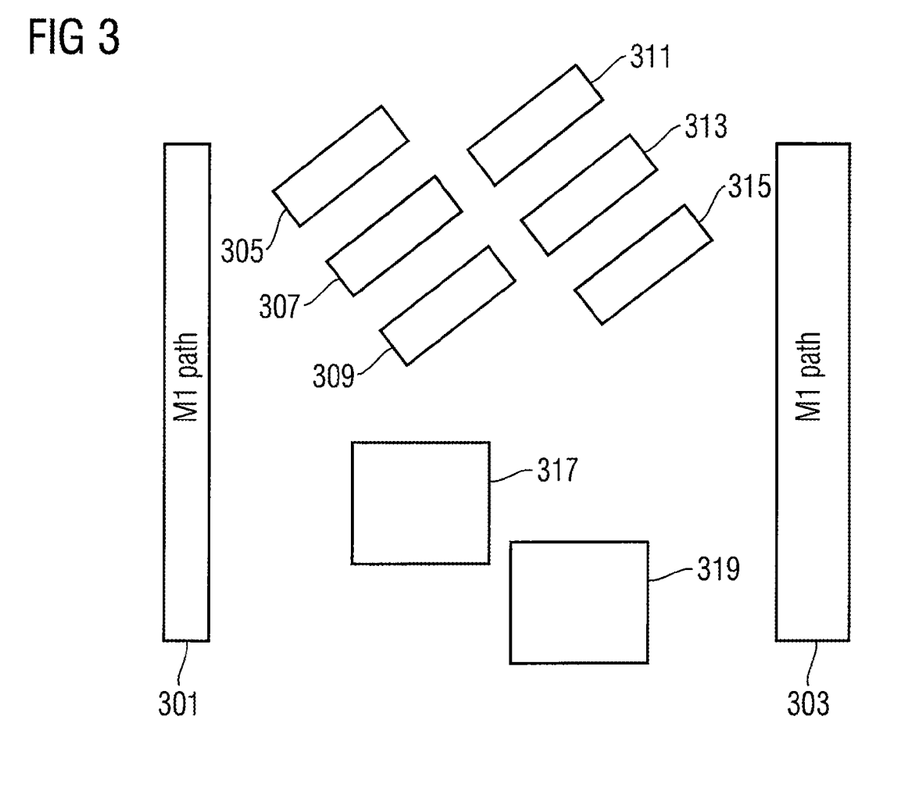
FIG. 3 shows a layout structure.

FIG. 3 shows a layout structure comprising a first conducting line 301, a second conducting line 303 and a fill element pattern comprising the fill elements 305, 307, 309, 311, 313 and 315. The fill elements 305 to 315 are rotated with respect to the conducting lines 301 and 303 so that an angle between an fill element axis extending perpendicularly to a side of each fill element and a direction in which the conducting lines 301 and 303 extend forms an angle which is greater than 0° and smaller than 90°. The layout structure further comprises non-rotated fill elements 317 and 319 filling remaining empty spaces between the conducting lines 301 and 303.

Figure 4:
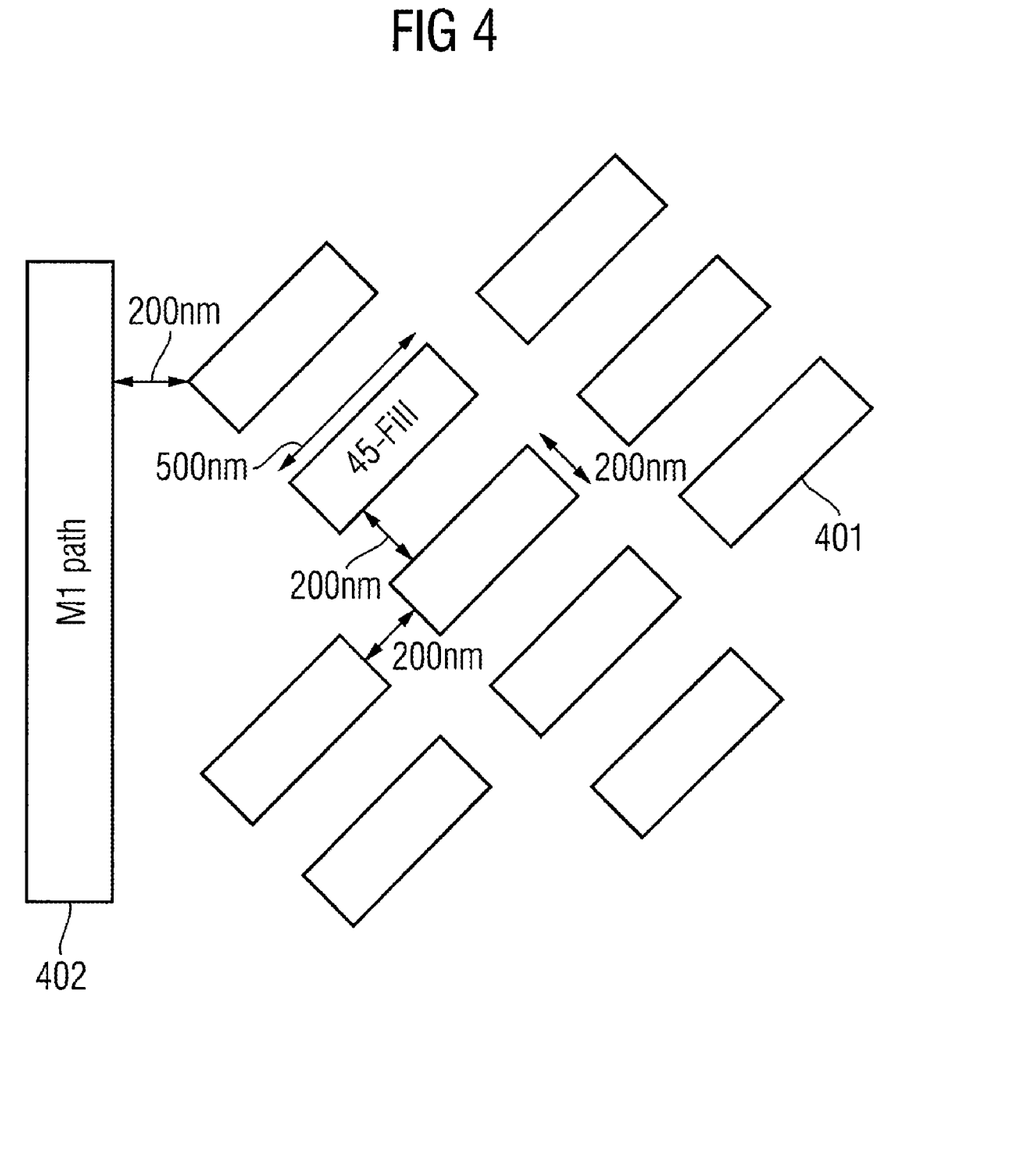
FIG. 4 shows a layout structure.

FIG. 4 shows a layout structure comprising a conducting line 402, e.g. a conductor, and a plurality of fill elements 401 rotated by 45° with respect to the conducting line direction. The fill elements 401 are spaced apart by e.g. 200 nm, wherein a distance between the conducting line 402 and a fill element is 200 nm or greater. By way of example, the length of each fill element 401 is 500 nm. The fill elements shown in FIG. 4 are arranged to form rows or columns of a fill element pattern, wherein each row or column is rotated with respect to the conducting line direction by e.g. 45°.

Figure 5:
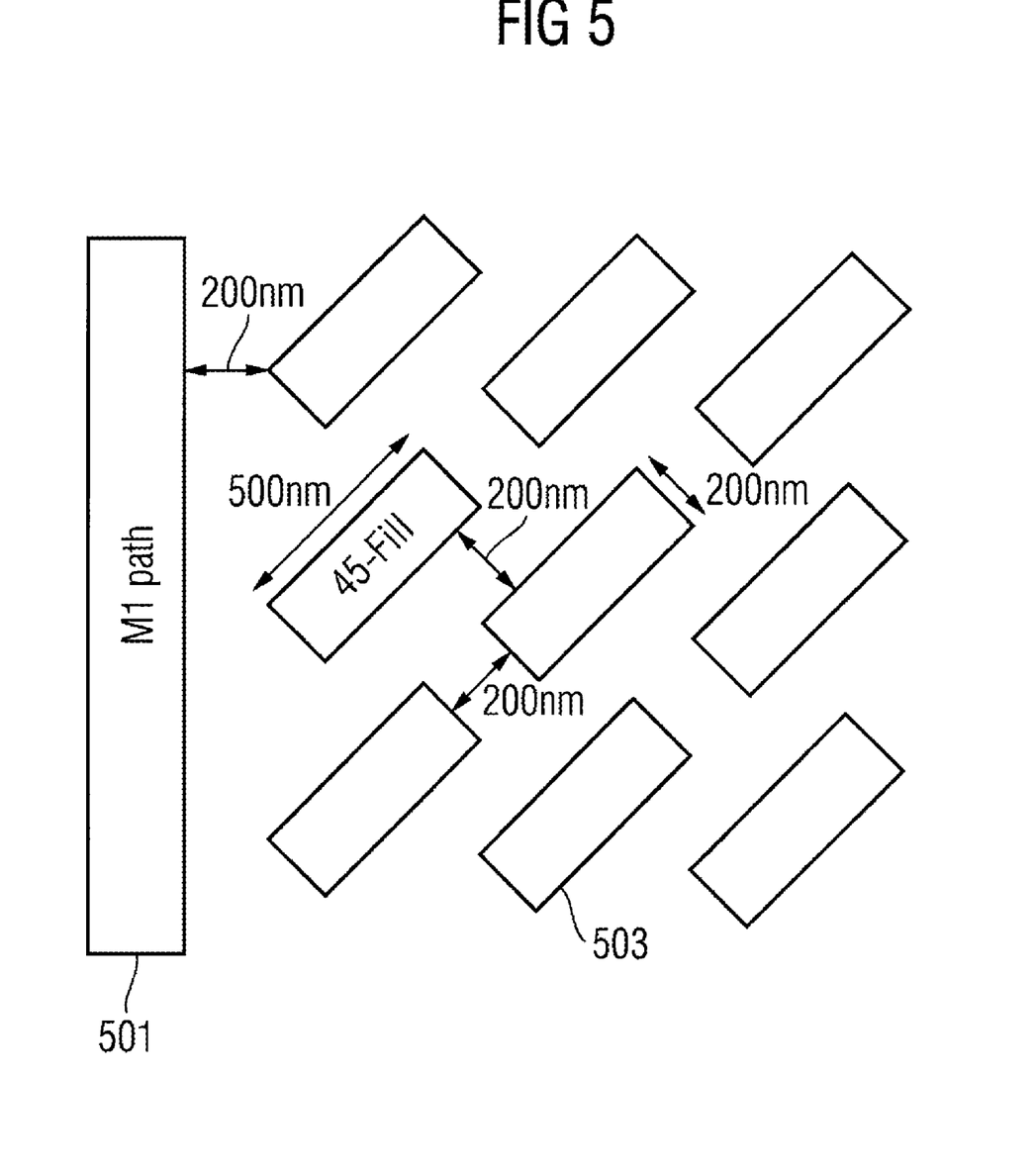
FIG. 5 shows a layout structure.

FIG. 5 shows a layout structure comprising a conducting line 501 and a plurality of fill elements 503 rotated with respect to the conducting line by e.g. 45°. The fill elements are arranged to form rows and columns of a fill element pattern, wherein the columns are arranged parallel to the conducting line and wherein the rows are arranged perpendicular to the conducting line.

Figure 6A:
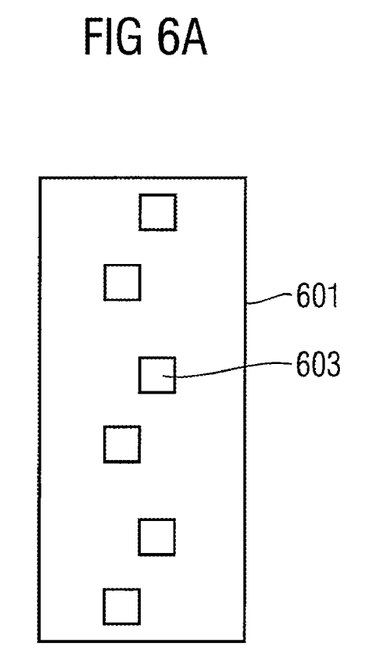
FIGS. 6a and 6b show layout structures.

FIG. 6a shows a conducting line 601 extending in a conducting line direction and comprising a plurality of holes 603 forming a hole pattern (chess hole shape). The main axes of the holes 603, which are substantially rectangular, are arranged in the conducting line direction or perpendicular thereto.

Figure 6B:
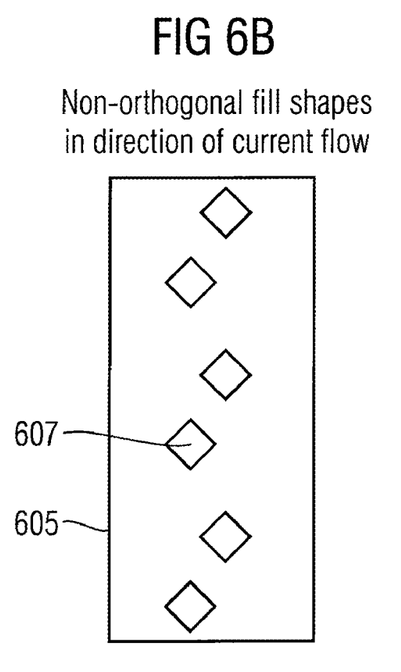

FIG. 6b shows a conducting line 605 comprising a plurality of holes 607 forming a hole structure. The holes 607 have substantially a rectangular shape and are rotated with respect to the conducting line direction in which the conducting line 605 extends. More specifically, each (rotated) hole 607 has an axis extending perpendicularly to a side of the hole in a direction which crosses the conducting line direction at an angle which is greater than 0° and smaller than 90° which is the range of the inventive rotation, according to one embodiment.

Figure 7A:
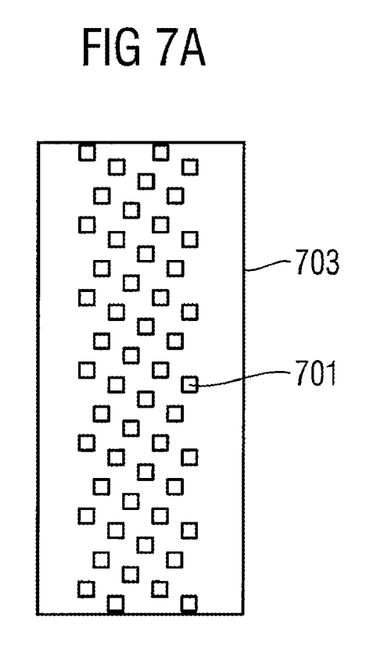
FIGS. 7a and 7b show layout structures.

FIG. 7a shows a plurality of holes 701 formed in a conducting line 703. The holes 701 are non-rotated and have main axes extending perpendicularly or in parallel to the conducting line direction.

Figure 7B:
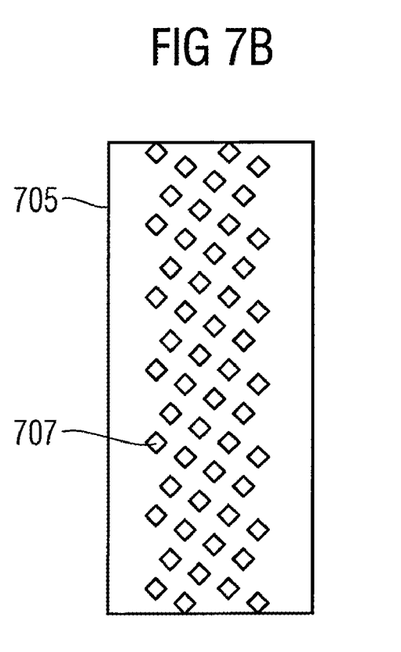

FIG. 7b shows a plurality of rotated holes 707 in a conducting line 705.

Figure 8A:
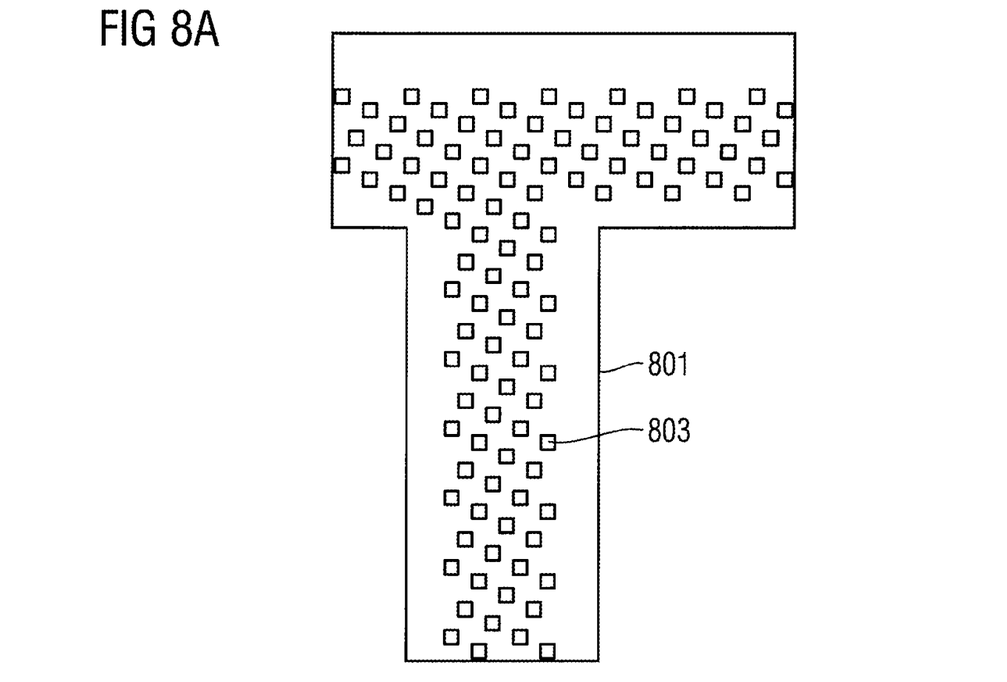
FIGS. 8a and 8b show layout structures.

FIG. 8a shows a substantially L-shaped conducting line 801 comprising a plurality of holes 803. The holes 803 are non-rotated with respect to a current direction, i.e. with respect to the main directions of the L-shaped metal path.

Figure 8B:
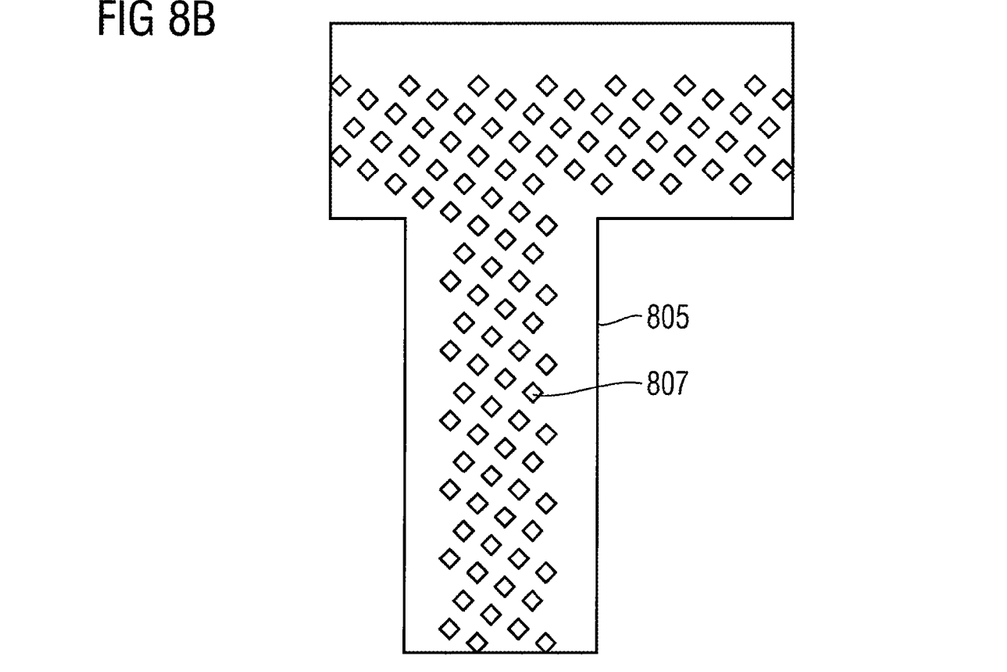

FIG. 8b shows a substantially T-shaped metal path 805 comprising a plurality of holes 807 having main axes which are rotated by e.g. 45° with respect to the both main directions of the T-shaped metal path 805.

Figure 9A:
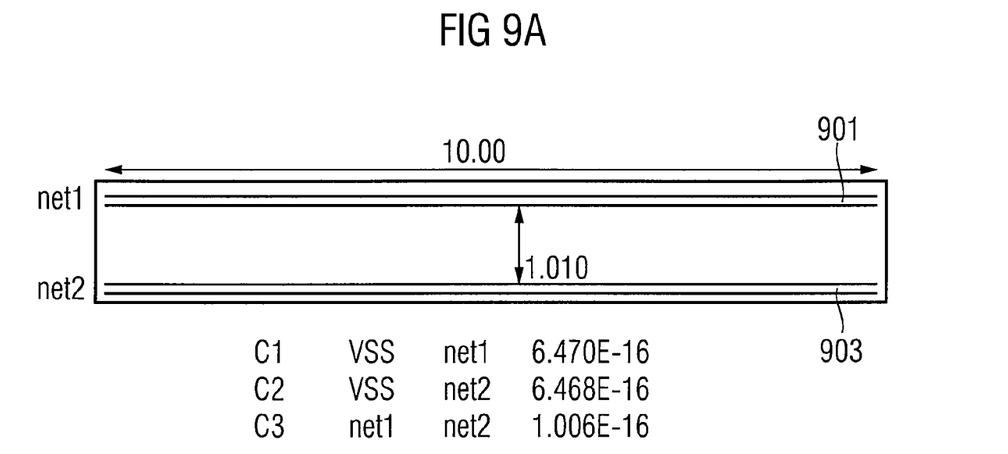
FIGS. 9a and 9b show layout structures.

FIG. 9a shows a fill structure comprising parallel conducting lines 901 and 903 without fill elements.

Figure 9B:
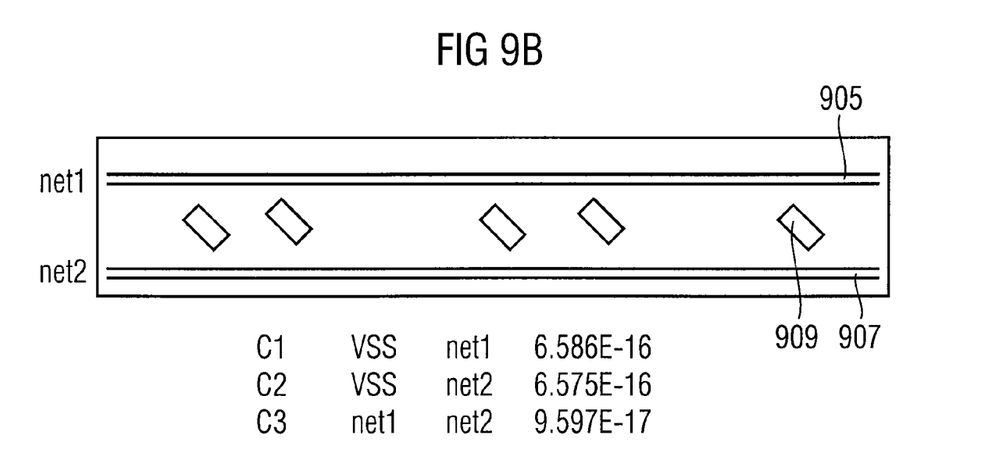

FIG. 9b shows two conducting lines 905 and 907 arranged in parallel, wherein fill elements 909 are e.g. pair-wise arranged between the conducting lines 905 and 907 such that there is a first distance between a first and a second adjacent fill element 909 and a second distance between the second adjacent fill element 909 and a third adjacent fill element 909, the first distance being less than the second distance. The fill elements 909 are rotated with respect to the conducting line directions in which the conducting lines 905 and 907 extend, wherein the rotation angle is e.g. in the range between 40° and 50°, e.g. 45° The fill structure shown in FIG. 9b does not have any significant detrimental impact on a resulting coupling capacity.

Figure 10:
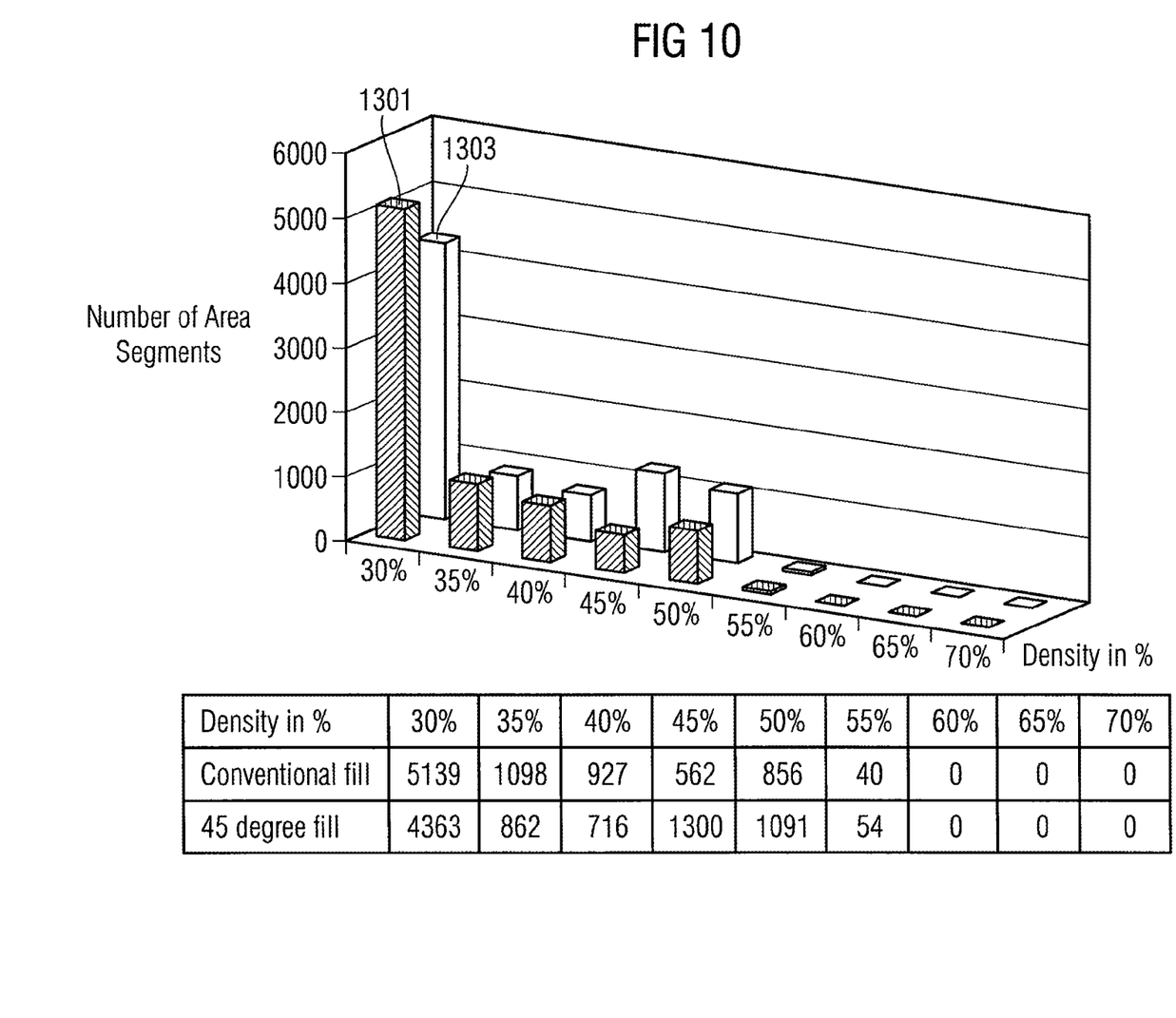
FIG. 10 shows a density distribution.

FIG. 10 shows a comparison between a density distribution associated with a non-rotated fill 1301 and the inventive fill 1303 rotated by e.g. 45°.

Figure 11:
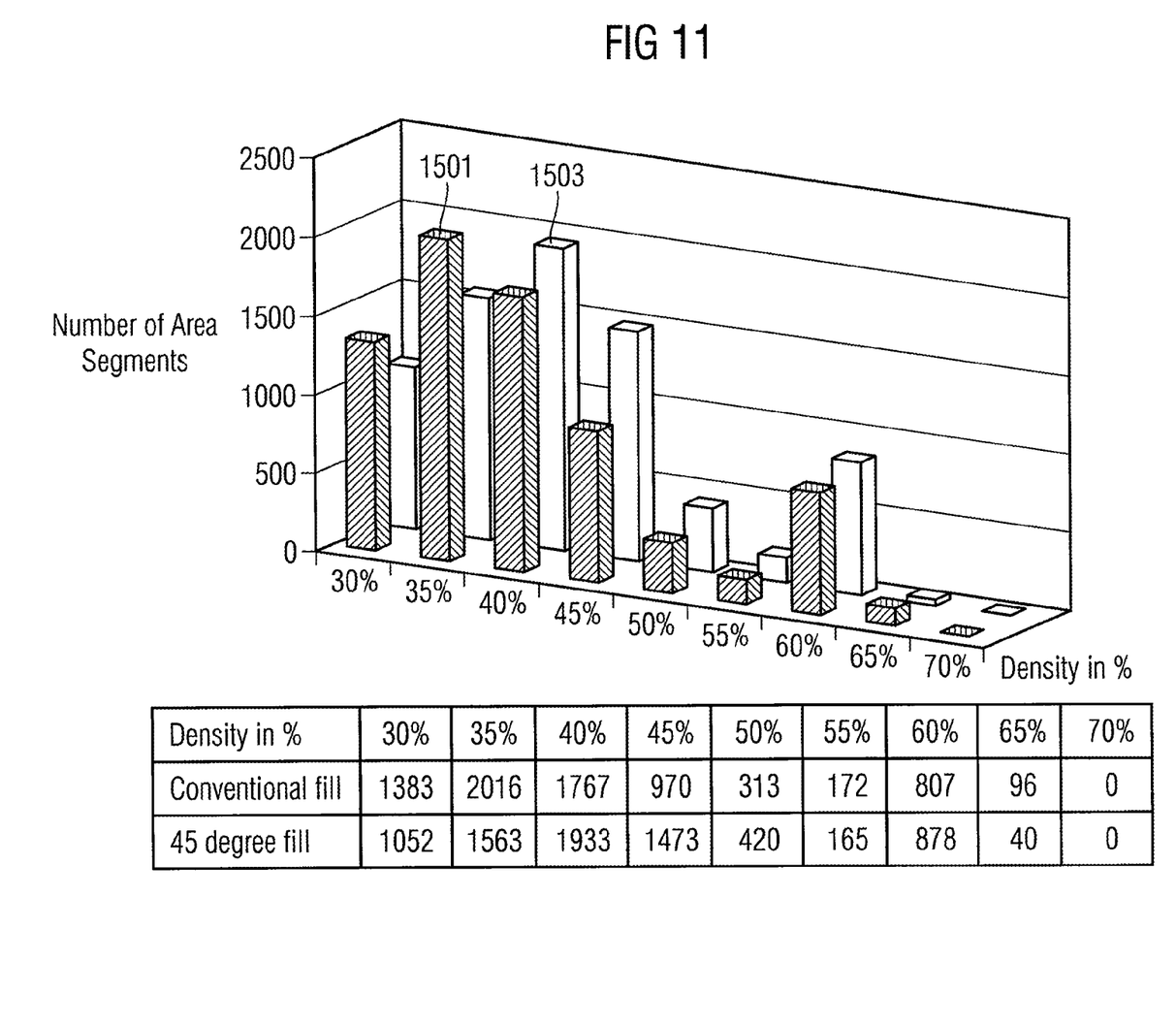
FIG. 11 shows a density distribution.

FIG. 11 shows a comparison between density distributions (metal 2) resulting when using a non-rotated fill approach 1501 and the inventive approach 1503 based on fill elements rotated by e.g. 45°.

Figure 12:
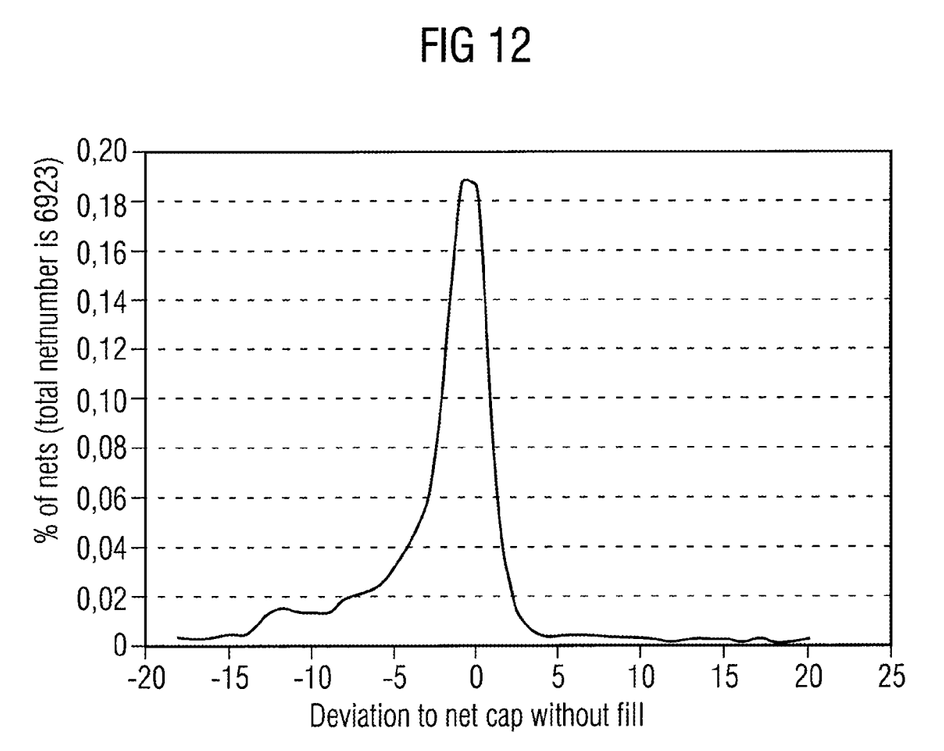
FIG. 12 shows a distribution of filled nets.

FIG. 12 shows a distribution of filled nets depending on net capacitance deviations resulting when fill elements are not present (inverted fill).

Figure 13:
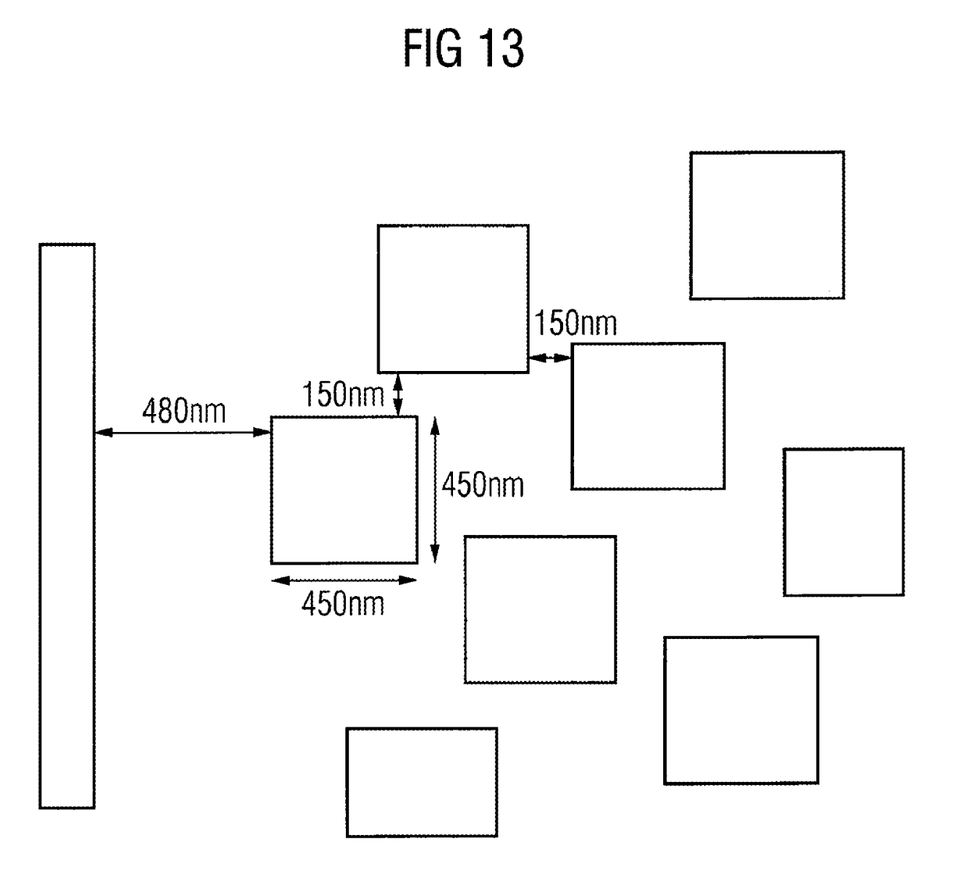
FIG. 13 shows a general placement principle for fill elements.

As depicted in FIG. 13, the fill algorithms based on non-rotated fill elements operate with fill shapes having dimensions of 450 nm*450 nm, spacing 150 nm having a spacing of 480 nm with respect to the drawn metal shapes. The fill shapes are rectangles with the dimension of 200 nm*500 nm, the spacing 200 nm forming a "chessboard" pattern and having a spacing to drawn lines of only 200 nm. According to one embodiment of the invention, the fill elements may be rotated by 45° which results in using non-orthogonal fill shapes.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise." The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

While the foregoing is directed to embodiments of the present invention, other and further embodiments of the invention may be devised without departing from the basic scope thereof, and the scope thereof is determined by the claims that follow.

What is claimed is:

1. A layout structure, comprising:
   a conducting line extending in a conducting line direction, the conducting line being arranged within a substrate area;
   at least one first fill element being arranged within the substrate area at a predetermined distance from the conducting line, the at least one first fill element having a first fill element axis extending perpendicularly to a side of the at least one first fill element in a first fill element direction, the at least one first fill element being rotated such that an angle between the conducting line direction and the first fill element direction is greater than 0° and less than 90°; and
   at least one second fill element oriented such that sides of the at least one second fill element are substantially orthogonal to the conducting line direction.

2. The layout structure according to claim 1, wherein the angle is between 40° and 50°.

3. The layout structure according to claim 1, further comprising a further conducting line arranged within the substrate area and extending in a further conducting line direction, an angle between the first fill element direction and the further conducting line direction being greater than 0° and less than 90°.

4. The layout structure according to claim 1, wherein the at least one first fill element comprises a plurality of first fill elements being arranged within the substrate area to form a fill pattern, each first fill element having a respective first fill element axis extending perpendicularly to a respective side of the first fill element in a respective first fill element direction, an angle between the conducting line direction and each of the plurality of first fill element directions being greater than 0° and less than 90°.

5. The layout structure according to claim 1, the at least one first fill element having a substantially rectangular shape.

6. A layout structure, comprising:
   a first conducting line extending in a first conducting line direction, the first conducting line being arranged within a substrate area;
   a second conducting line extending in a second conducting line direction, the second conducting line being arranged within the substrate area; and
   a plurality of fill elements being arranged within a substrate area to form an elongated fill element structure extending in a fill structure direction, each fill element having a fill element axis extending perpendicularly to a side of the fill element in a fill element direction, an angle between the fill structure direction and each fill element direction being greater than 0° and less than 90°; wherein
   the plurality of fill elements are pair-wise arranged such that there is a first distance between a first and a second adjacent fill element and a second distance between the second adjacent fill element and a third adjacent fill element, the first distance being less than the second distance.

7. The layout structure according to claim 6, wherein the first conducting line direction is the same as the second conducting line direction, such that the first and second conducting lines are parallel to each other.

8. The layout structure according to claim 6, wherein the elongated fill element structure is arranged between the first conducting line and the second conducting line.

9. A device for coupling, comprising:
   a means for conducting extending in a conducting direction, the means for conducting being arranged within a substrate area;
   at least one first means for filling being arranged within the substrate area at a predetermined distance from the means for conducting, the at least one first means for filling having a first fill axis extending perpendicularly to a side of the at least one first means for filling in a first fill axis direction, the at least one first means for filling being rotated such that an angle between the conducting direction and the first fill direction is greater than 0° and less than 90°; and
   at least one second means for filling oriented such that sides of the at least one second means for filling are substantially orthocional to the conducting line direction.

10. The device for coupling according to claim 9, the angle being in the range between 40° and 50°.

11. The device for coupling according to claim 9, wherein the at least one first means for filling comprises a plurality of first means for filling being arranged within the substrate area to form a fill pattern, each first means for filling having a first fill axis extending perpendicularly to a side of the first means for filling in a first fill axis direction, an angle between the conducting direction and each first fill axis direction being greater than 0° and less than 90°.

12. A device for coupling, comprising:
   a first means for conducting extending in a first means for conducting direction, the first means for conducting being arranged within a substrate area;
   a second means for conducting extending in a second means for conducting direction, the second means for conducting being arranged within the substrate area; and
   a plurality of means for filling being arranged within the substrate area to form an elongated fill structure extending in a fill structure direction, each means for filling having a fill axis extending perpendicularly to a side of the means for filling in a fill axis direction, an angle between the fill structure direction and each fill axis direction being greater than 0° and less than 90°; wherein the plurality of means for filling are pair-wise arranged such that there is a first distance between a first and a second adjacent means for filling and a second distance between the second adjacent means for filling and a third adjacent means for filling, the first distance being less than the second distance.

13. The device for coupling according to claim 12, wherein the elongated fill structure is arranged between the first means for conducting and the second means for conducting.

* * * * *

UNITED STATES PATENT AND TRADEMARK OFFICE
CERTIFICATE OF CORRECTION

| | |
|---|---|
| PATENT NO. | : 7,709,962 B2 |
| APPLICATION NO. | : 11/553788 |
| DATED | : May 4, 2010 |
| INVENTOR(S) | : Alexander Nielsen et al. |

Page 1 of 1

It is certified that error appears in the above-identified patent and that said Letters Patent is hereby corrected as shown below:

In claim 9, at column 8, line 46, delete "orthocional" and insert --orthogonal--.

Signed and Sealed this

Seventh Day of September, 2010

David J. Kappos
*Director of the United States Patent and Trademark Office*